(12) United States Patent
Yamazaki et al.

(10) Patent No.: US 6,734,941 B2
(45) Date of Patent: May 11, 2004

(54) LIQUID CRYSTAL DISPLAY DEVICE

(75) Inventors: Hiroyuki Yamazaki, Chiba (JP); Tomio Oosone, Ooamishirasato (JP); Tetsuya Kawamura, Mobara (JP)

(73) Assignees: Hitachi, Ltd., Tokyo (JP); Hitachi Device Engineering Co., Ltd., Chiba-ken (JP)

(*) Notice: Subject to any disclaimer, the term of this patent is extended or adjusted under 35 U.S.C. 154(b) by 0 days.

(21) Appl. No.: 10/287,663

(22) Filed: Nov. 5, 2002

(65) Prior Publication Data

US 2003/0086049 A1 May 8, 2003

(30) Foreign Application Priority Data

Nov. 8, 2001 (JP) ........................................ 2001-343109

(51) Int. Cl.⁷ ............................................. G02F 1/1345
(52) U.S. Cl. ...................................... 349/150; 349/152
(58) Field of Search ................................. 349/149, 150, 349/151, 152

(56) References Cited

U.S. PATENT DOCUMENTS

| | | | |
|---|---|---|---|
| 6,211,936 B1 * | 4/2001 | Nakamura | 349/152 |
| 6,407,844 B1 * | 6/2002 | Yang et al. | 359/224 |
| 6,583,844 B1 * | 6/2003 | Mishima et al. | 349/149 |

FOREIGN PATENT DOCUMENTS

| | | | | |
|---|---|---|---|---|
| JP | 2001135896 A | * | 5/2001 | ............ H05K/1/02 |
| JP | 2003100737 A | * | 4/2003 | ......... H01L/21/312 |
| JP | 2003149665 A | * | 5/2003 | ......... G02F/1/1345 |

* cited by examiner

*Primary Examiner*—Tarifur R. Chowdhury
*Assistant Examiner*—David Y. Chung
(74) *Attorney, Agent, or Firm*—Reed Smith LLP; Stanley P. Fisher, Esq.; Juan Carlos A. Marquez, Esq.

(57) ABSTRACT

In a liquid crystal display device having a flexible printed circuit board which includes a laminated structure of a pair of flexible films, a plurality of first conductive layers interposed between inner surfaces of the flexible films to be spaced from each other, and a plurality of groups of terminals formed on an outer surface of one of flexible films opposite to the respective first conductive layers, and a liquid crystal display panel which includes a plurality of groups of wirings formed on one of a pair of substrates thereof and connected to the plurality of groups of terminals respectively, the present invention interposes second conductive layers at respective portions spacing the plurality of first conductive layers between the inner surfaces of the flexible films and prevents the one of the pair of substrates from being cracked when the plurality of terminals of the flexible printed circuit board are connected to the groups of wiring of the one of the substrates by compression bonding thereby.

7 Claims, 4 Drawing Sheets

LIQUID CRYSTAL DISPLAY DEVICE

BACKGROUND OF THE INVENTION

1. Field of the Invention

The present invention relates to a liquid crystal display device, and more particularly to a liquid crystal display device which can enhance the reliability by obviating the occurrence of cracks in a substrate of a liquid crystal display panel when output terminals of a flexible printed circuit board are connected to electrode terminals of a liquid crystal display panel by compression bonding.

2. Description of the Related Art

In a panel type display device such as a liquid crystal display device, a display region having a plurality of pixels constituted of electrodes and active elements is formed on an inner surface of an insulating substrate made of glass or the like, and a flexible printed circuit board is popularly used as connection means between driving circuits of the pixels and external devices such as host computers for applying signals and voltages for displaying (hereinafter also referred to as display signals) to these pixels. Here, the explanation is made using the liquid crystal display device as an example, the same goes for an organic EL display device, a field emission type cathode ray tube and the like.

For example, in an active matrix type liquid crystal display device which is currently well known as this type of panel type display device, in general, a display region having active elements such as thin film transistors provided for respective pixels is formed on one substrate of a liquid crystal display panel which sandwiches liquid crystal between two sheets of substrates, and a plurality of driving circuit chips which perform switching driving of these active elements are provided on a periphery of the substrate or in the vicinity of the periphery of the substrate.

Various methods have been known as modes for mounting the driving circuit chips on the liquid crystal display panel. One of such modes is a so-called flip chip method (hereinafter referred to as "FCA method") which directly mounts the driving circuit chips on the periphery of the substrate which constitutes the liquid crystal display panel. Besides such a method, a method which mounts the above-mentioned driving circuit chips on the flexible printed circuit board or a method which mounts the above-mentioned driving circuit chips on an interface substrate interposed between the liquid crystal display panel and the external device has been commercialized. In these methods, electrode terminals are pulled out from the display region of the liquid crystal display panel and outputs of the driving circuit chips which apply display signals to these electrode terminals are connected to the electrode terminals.

In the FCA method, the output terminals of the driving circuit chips are directly connected to the above-mentioned electrode terminals. Further, to panel input terminals which are formed on the glass substrate and are connected with input terminals of the driving circuit chips, the output terminals of the flexible printed circuit board are connected through an anisotropic conductive film by compression bonding.

In the method which mounts the driving circuit chips on the flexible printed circuit board or in the method which mounts the driving circuit chips on the interface substrate, the electrode terminals which are pulled out from the display region of the liquid crystal display panel are used as the panel input terminals and the output terminals of the flexible printed circuit board are connected to these panel input terminals using the same means by compression bonding.

Further, various methods have been also proposed for supplying display signals and, recently, a data transfer method which sequentially transfers display signals with respect to a plurality of driving circuit chips mounted in the FCA method has been popularly adopted. This data transfer method is a method which sequentially transfers driving signals to the driving circuit chip of succeeding stage in response to the completion of the pixel selection operation of the driving circuit chip of preceding stage. This data transfer method reduces a burden incurred by wiring at the flexible printed circuit board side by mounting some display signal paths on the substrate of the liquid crystal display panel.

FIG. 7A and FIG. 7B are schematic views for explaining an essential part of a liquid crystal display device in which a flexible printed circuit board is connected to a liquid crystal display panel adopting the data transfer method which is provided with driving circuit chips of FCA method. FIG. 7A is a plan view of the liquid crystal display device and FIG. 7B is a cross-sectional view taken along a line A–A' in FIG. 7A. In FIG. 7A and FIG. 7B, reference symbol SUB1 indicates one substrate which constitutes a liquid crystal display panel LCD, reference symbol SUB2 indicates another substrate which constitutes the liquid crystal display panel LCD, reference symbol CH1 indicates driving circuit chips at a scanning signal supply side (hereinafter also referred to as gate drivers), and reference symbol CH2 indicates driving circuit chips at a video signal supply side (hereinafter also referred to as drain drivers).

Further, reference symbol FPC1 indicates a first flexible printed circuit board which is connected to one substrate SUB1 side on which the gate drivers CH1 are mounted and reference symbol FPC2 indicates a second flexible printed circuit board which is connected to one substrate SUB1 side on which the drain drivers CH2 are mounted. The constitution around the wiring of the first flexible printed circuit board FPC1 and the gate drivers CH1 of the liquid crystal display panel LCD is substantially equal to the constitution around the wiring of the second flexible printed circuit board FPC2 and the drain drivers CH2, so that the constitution around the wiring of the first flexible printed circuit board FPC1 and the gate driver CH1 of the liquid crystal display panel LCD is explained here.

With respect to the first flexible printed circuit board FPC1, on a base film BFM, a wiring pattern PTN having an input terminal portion TM which is connected to an interface printed circuit board not shown in the drawing and output terminals FTM which are connected to the wiring pattern PTN are formed. Here, the output terminals FTM are exposed from a cover film. Although the wiring pattern PTN is covered with the cover film in the same manner except for the output terminals FTM and the input terminal portion TM (a connection portion with the interface substrate) provided to an end portion of the wiring pattern PTN, the illustration of such a constitution is omitted from FIG. 7A and FIG. 7B.

The wiring pattern PTN of the first flexible printed circuit board FPC1 is formed to be extended in the longitudinal direction of the first flexible printed circuit board FPC1 from an input terminal portion TM thereof connected to an interface printed circuit board (not shown in the drawing). Output terminals FTM of the first flexible printed circuit board FPC1 are arranged as a plurality of groups of terminals protruded between a plurality of gate drivers CH1 respectively from the region where the wiring pattern PTN is formed in the direction transverse to the wiring pattern PTN.

The output terminals FTM of the first flexible printed circuit board FPC1 are exposed to overlap to panel inputting terminals LTM of the liquid crystal display panel LCD in an opposed manner and are connected to the panel inputting terminals LTM using an anisotropic conductive film ACF. Here, the panel inputting terminals LTM which constitute inputting terminals of the driving printed circuit board are not shown in FIG. 7A. Each of terminal groups being formed of plural terminals is simply described as a terminal for convenience in this specification.

SUMMARY OF INVENTION

This compression bonding connection is performed by heating and pressing to a substrate (a first substrate SUB1) of a liquid crystal display panel LCD in a direction indicated by an arrow P from a back-surface side (a cover film CVR side in FIG. 7B) of the first flexible printed circuit board FPC. As shown in FIG. 7A, the output terminals FTM of the first flexible printed circuit board FPC1 are positioned such that they are deviated or concentrated between the driving circuit chips CH1 and are not arranged uniformly. As a result, the panel inputting terminals LTM at the liquid crystal display panel LCD side and the output terminals FTM at the first flexible printed circuit board FPC1 side are connected to each other in a conductive manner. The connection state is indicated as FTM/LTM in FIG. 7A.

In performing this connection operation by compression bonding, there may arise a phenomenon that cracks occur in the first substrate SUB1. The reason that such cracks occur is considered as follows. That is, since the arrangement of the output terminals FTM of the flexible printed circuit board FPC1 is not uniform, when the compression bonding connection is performed, a stress is concentrated on connection portions between the input terminals LTM at the liquid crystal display panel LCD side and the output terminals FTM at the flexible printed circuit board FPC1 side. Particularly, this phenomenon appears noticeably in a connection method with a small number of terminals which adopts "a data transfer method" in which the scanning signals and the video signals are sequentially transmitted to the driving circuit chips. However, in mounting methods and connection methods other than the FCA method, a similar phenomenon may arise depending on the arrangement state of terminals and the number of arranged terminals. These phenomena reduces the reliability of the liquid crystal display device and also hampers the enhancement of the yield.

Further, besides the above-mentioned phenomena which arise at the gate-driver-side substrate, a similar phenomenon may also arise at the time of connecting the flexible printed circuit board to the drain driver side.

Accordingly, it is an object of the present invention to provide a liquid crystal display device which can obviate the occurrence of cracks in a substrate of a liquid crystal display panel when output terminals of a flexible printed circuit board are connected to panel input terminals of a liquid crystal display panel by compression bonding thus enhancing the reliability of the liquid crystal display device.

According to the present invention, the above-mentioned object is achieved by providing a dummy pattern made of a conductor similar to a conductor of a wiring pattern to portions where terminals of a flexible printed circuit board are not arranged. Typical structures of the liquid crystal display device according to the present invention are described hereinafter.

Structure (1):

In a liquid crystal display device including a liquid crystal display panel which forms a display region by sandwiching liquid crystal between a pair of substrates having electrodes for selection of pixels on one inner surface or both inner surfaces thereof and has panel input terminals at a periphery of one of the pair of substrates for applying display signals to a plurality of electrode terminals pulled out from the display region, and a flexible printed circuit board having a multi-layered structure which includes output terminals connected to the panel input terminals for applying display signals to the electrodes, the improvement is characterized in that the panel input terminals are formed of a plurality of groups of terminals which are arranged at a given interval along the longitudinal direction of the periphery of one of the pair of substrates, the flexible printed circuit board includes input terminals which are connected to an external circuit and the output terminals which are connected to the panel input terminals, and a conductive pattern which connects the input terminals and the output terminals by wiring, and at portions of the flexible printed circuit board corresponding to positions between the electrode terminals of the liquid crystal display panel, dummy conductive patterns which are capable of reducing the stress concentration when the output terminals of the flexible printed circuit boards are overlap the corresponding panel input terminals of the liquid crystal display panel to connect by compression bonding are provided.

Due to such a constitution, the dummy conductive pattern receives the pressing force which is applied to the overlapped portions between the panel input terminals of the liquid crystal display panel and the output terminals of the flexible printed circuit board when the compression bonding is performed. Accordingly, it is possible to prevent the excessive stress from being applied to the overlapped portion of neighboring panel input terminal and the output terminal thus suppressing the occurrence of cracks in the substrate of the liquid crystal display panel.

Structure (2):

In the above-mentioned constitution (1), driving circuit chips which apply display signals to the electrode terminals are directly mounted on one substrate between the electrode terminals and the panel input terminals.

In the data transfer method which directly mounts the driving circuit chips on the substrate of the liquid crystal display panel using the FCA method, the number of the panel input terminals of the liquid crystal display panel and the output terminals of the flexible printed circuit board is small compared to conventional driving methods. Accordingly, the stress concentration which is generated on the overlapped portions between the above-mentioned panel input terminals and output terminals is large. However, with the provision of the dummy conductive pattern formed on the overlapped portion of the neighboring panel input terminal and output terminal, such a stress concentration can be reduced. Accordingly, the occurrence of cracks on the substrate of the liquid crystal display panel can be suppressed.

Structure (3):

In the above-mentioned structure (1), driving circuit chips which apply display signals to the electrode terminals are mounted on the flexible printed circuit board.

Structure (4):

In the above-mentioned structure (1), the liquid crystal display device includes an interface printed circuit board to which the input terminals of the flexible printed circuit board are connected, and driving circuit chips which supply display signals to the electrode terminals are mounted on the interface printed circuit board.

In the liquid crystal display device which mounts the driving circuit chips on the flexible printed circuit board or on the interface printed circuit board, the number of panel input terminals of the liquid crystal display panel and output terminals of the flexible printed circuit board is larger than in the liquid crystal display device which adopts the FCA method. However, the stress concentration which is generated on the overlapped portions between the panel input terminals and the output terminals when these terminals are arranged non-uniformly on design can be reduced due to the dummy conductive pattern, so that the occurrence of cracks on the liquid crystal display panel can be suppressed.

The above-mentioned advantageous effects can be obtained by the structure of another liquid crystal display device according to the present invention which is described hereinafter.

Structure (5):

In a liquid crystal display device comprising a liquid crystal display panel having a display region which includes a pair of substrates, a liquid crystal layer sealed between the pair of substrates, and a plurality of pixels formed in a state that the pixels face the liquid crystal layer, a control circuit which controls an image display operation performed by the plurality of pixels, and a flexible printed circuit board which has a plurality of connection terminals which are connected to one end portion (at least along one side of one substrate which is projected from an end portion of the other substrate) of one of the pair of substrates and transfers image display control signals or video data (video signals) from the control circuit to the liquid crystal display panel through the connection terminals, wherein the flexible printed circuit board includes a trunk portion which extends along the end portion of one substrate and a plurality of branch portions which are projected corresponding to a plurality of respective (groups of) connection terminals from the trunk portion to the end portion of one substrate;

the trunk portion and the branch portions have a laminated structure which is constituted of a pair of flexible films (for example, resin films which are referred to as a base film and a cover film) and a plurality of conductive patterns (for example, conductive layers made of metal or alloy) formed between the pair of flexible films corresponding to the branch portions;

the plurality of (groups of) connection terminals are formed on an outer surface (a surface at a side opposite to the conductive pattern or, in other words, an outer surface of the laminated structure) of one of the pair of flexible films such that respective groups of the plurality of connection terminals correspond to the plurality of branch portions; and between the pair of flexible films, another conductive layers are formed in a spaced-apart manner such that another conductive layer is arranged between a pair of neighboring conductive patterns among the plurality of conductive patterns.

According to the structure (5), when N pieces of the branch portions are projected from the trunk portion, (N−1) pieces of the another conductive layers are arranged in parallel along the extending direction of the trunk portion. The another conductive layers may be formed such that the another conductive layers are arranged at the liquid crystal display panel side of the trunk portion as so-called dummy patterns which are electrically separated from both of wiring for signal transmission and wiring for supplying electric power to the liquid crystal display panel in the flexible printed circuit board.

The present invention is not limited to the above-mentioned constitutions and the constitutions of embodiments which will be explained hereinafter. It is needless to say that various modifications can be made without departing from the technical concept of the present invention. For example, the present invention is applied in the same manner to the compression bonding connection between the input terminals of the flexible printed circuit board and the output terminals of the interface printed circuit board and the compression bonding connection between the flexible printed circuit board and the hard printed circuit board.

BRIEF DESCRIPTION OF THE DRAWINGS

FIG. 1A and FIG. 1B are schematic views for explaining a constitutional example of one embodiment of a flexible printed circuit board for use in a liquid crystal display device according to the present invention, wherein FIG. 1A is a plan view and FIG. 1B is a cross-sectional view taken along a line A–A' in FIG. 1A;

FIG. 2A and FIG. 2B are schematic views for explaining an essential part of one embodiment of a liquid crystal display device in which the flexible printed circuit board is connected to a liquid crystal display panel provided with driving circuit chips of an FCA method according to the present invention, wherein FIG. 2A is a plan view and FIG. 2B is a cross-sectional view taken along a line B–B' in FIG. 2A;

FIG. 7A and FIG. 7B are schematic views for explaining an essential part of a liquid crystal display device in which a flexible printed circuit board is connected to a liquid crystal display panel of a data transfer method provided with driving circuit chips of an FCA method, wherein FIG. 7A is a plan view and FIG. 7B is a cross-sectional view taken along a line A–A' in FIG. 7A.

DETAILED DESCRIPTION

Figure 1A:
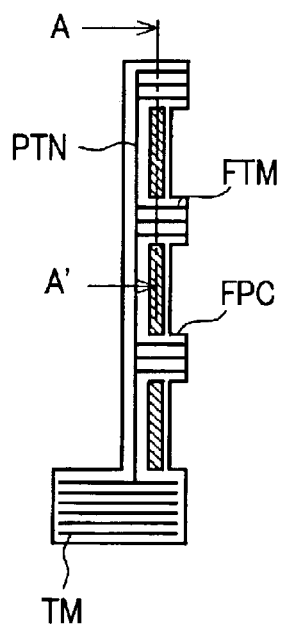
Figure 1B:
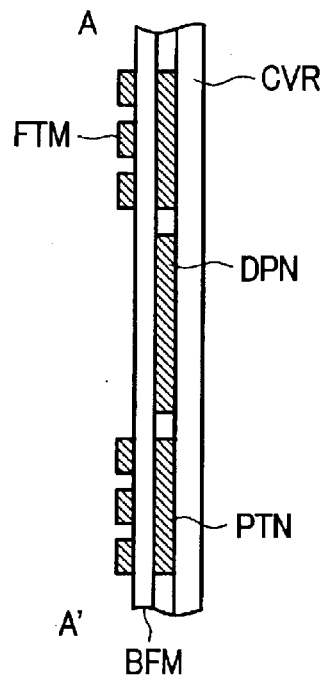

The preferred embodiments of the present invention are explained in detail hereinafter in conjunction with drawings showing these embodiments. FIG. 1A and FIG. 1B are schematic views for explaining a constitutional example of one embodiment of a flexible printed circuit board for use in a liquid crystal display device according to the present invention, wherein FIG. 1A is a plan view and FIG. 1B is a cross-sectional view taken along a line A–A' in FIG. 1A.

This flexible printed circuit board constitutes a first flexible printed circuit board FPC1 which is mounted on a gate drive side of a liquid crystal display panel. As shown in FIG. 1B, the first flexible printed circuit board FPC1 includes a wiring pattern PTN and a dummy conductive pattern DPN at one side of a base film BFM and they are covered with a cover film CVR.

At the other side of the base film BFM, output terminals FTM which are electrically connected with the above-mentioned wiring pattern PTN are formed. As shown in FIG. 1A and FIG. 1B, the output terminals FTM are arranged irregularly or non-uniformly for every group consisting of a plurality of output terminals FTM. The dummy conductive pattern DPN is provided between these groups of output terminals FTM. The dummy conductive pattern DPN is provided in the vicinity of a center portion of the arrangement of a group of output terminals FTM which are pressed mainly by a compression bonding tool.

Figure 2A:
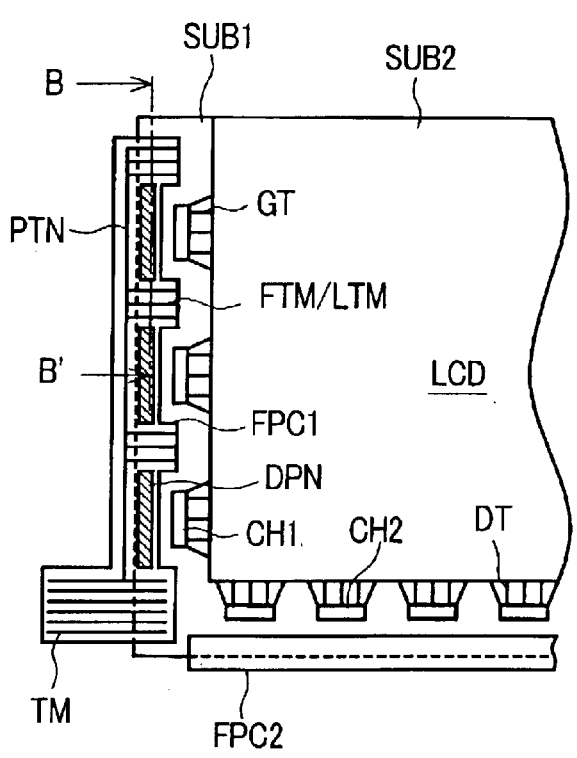
Figure 2B:
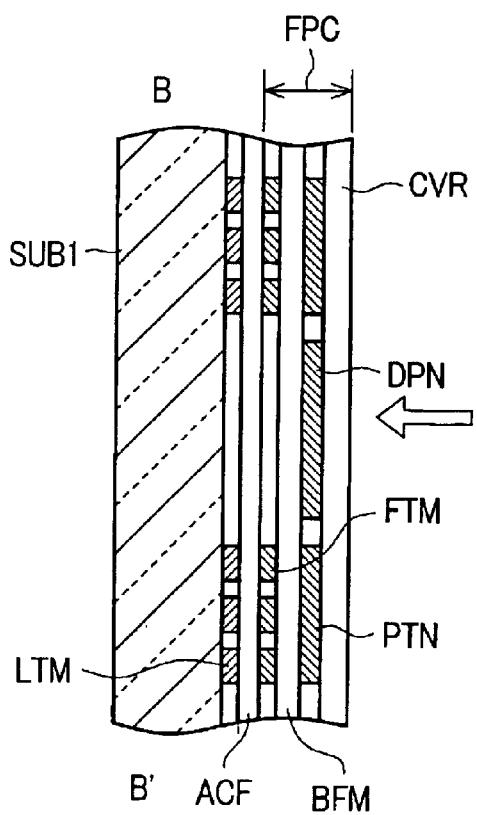

FIG. 2A and FIG. 2B are schematic views for explaining an essential part of one embodiment of a liquid crystal display device in which the flexible printed circuit board is connected to a liquid crystal display panel provided with driving circuit chips of an FCA method according to the present invention, wherein FIG. 2A is a plan view and FIG. 2B is a cross-sectional view taken along a line B–B' in FIG. 2A. In FIG. 2A and FIG. 2B, reference symbols which are equal to the reference symbols shown in FIG. 1A and FIG. 1B indicate parts having identical functions. The flexible printed circuit board constitutes the first flexible printed circuit board FPC1 explained in conjunction with FIG. 1A and FIG. 1B.

In FIG. 2A and FIG. 2B, reference symbol SUB1 indicates one substrate which constitutes a liquid crystal display panel LCD (here, a thin film transistor substrate having thin film transistors as active elements), reference symbol SUB2 indicates another substrate (here, a color filter substrate which faces the thin film transistor substrate in an opposed manner), reference symbol CH1 indicates driving circuit chips at a scanning signal supply side (hereinafter, referred to as a gate driver), and reference symbol CH2 indicates driving circuit chips at a video signal supply side (hereinafter, referred to as a drain driver).

In the above-mentioned manner, reference symbol FPC1 indicates the first flexible printed circuit board which is connected to one substrate SUB1 side on which the gate drivers CH1 are mounted and reference symbol FPC2 indicates the second flexible printed circuit board which is connected to one substrate SUB1 side on which the drain drivers CH2 are mounted. The constitution around the wiring of the first flexible printed circuit board FPC1 and the gate driver CH1 of the liquid crystal display panel LCD is substantially equal to the constitution around the wiring of the second flexible printed circuit board FPC2 and the drain driver CH2, so that the constitution around the wiring of the first flexible printed circuit board FPC1 and the gate driver CH1 of the liquid crystal display panel LCD is explained here.

With respect to the first flexible printed circuit board FPC1, on the base film BFM, the wiring pattern PTN having an input terminal portion TM which is connected to an interface printed circuit board not shown in FIG. 2A and FIG. 2B and an output terminal FTM which is connected to the wiring pattern PTN are formed. Here, the output terminal FTM is exposed from the cover film CVR. Although the wiring pattern PTN is covered with the cover film CVR in the same manner except for the output terminal FTM and the input terminal portion TM (a connection portion with the interface substrate) provided to an end portion of the wiring pattern PTN, the illustration of such a constitution is omitted from the drawings.

The wiring pattern PTN of the first flexible printed circuit board FPC1 is formed of a wiring pattern which has the input terminal portion TM thereof connected to an interface printed circuit board (not shown in FIG. 2A and FIG. 2B) and is extended in the longitudinal direction of the first flexible printed circuit board FPC1. Output terminals FTM of the first flexible printed circuit board FPC1 are arranged as a plurality of groups of terminals between a plurality of gate drivers CH1 in the direction which crosses the wiring pattern PTN from the region where the wiring pattern PTN is formed.

As mentioned previously, the output terminals FTM of the first flexible printed circuit board FPC1 are exposed and are to overlap the panel inputting terminals LTM of the liquid crystal display panel LCD in an opposed manner and are connected to the panel inputting terminals LTM using an anisotropic conductive film ACF. Here, the inputting terminal TM which constitutes an inputting terminal of the driving circuit board (the first flexible printed circuit board FPC1) is not shown in FIG. 2B. In this liquid crystal display panel LCD, electrode terminals GT which are pulled out from a display region of the liquid crystal display panel are connected to the output terminals of the gate drivers CH1, while the panel input terminals LTM which are connected to the input terminals of the gate drivers CH1 are bonded by compression to the output terminals FTM of the flexible printed circuit board FPC1 by way of a pattern (not shown in FIG. 2A and FIG. 2B) which is wired on the first substrate SUB1 in the direction indicated by an arrow P.

Figure 3:
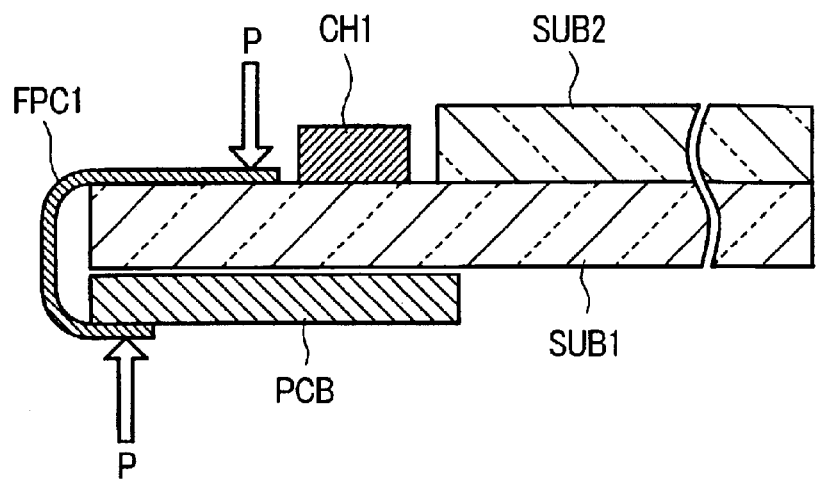
FIG. 3 is a schematic cross-sectional view for explaining an essential part of one embodiment of the liquid crystal display device according to the present invention.

FIG. 3 is a schematic cross-sectional view for explaining an essential part of one embodiment of the liquid crystal display device according to the present invention. In this liquid crystal display device, the driving circuit chip (driver) is mounted using the FCA method explained in conjunction with FIG. 2A and FIG. 2B, wherein the gate driver CH1 is directly mounted on the periphery of the first substrate SUB1 of the liquid crystal display panel.

Input terminals of the first flexible printed circuit board FPC1 are connected to terminal portions of an interface printed circuit board PCB. The interface printed circuit board PCB is bent toward a back surface of the first substrate SUB1 and is accommodated in the rear surface of the liquid crystal display panel. The input terminals of the first flexible printed circuit board FPC1 and the terminals of the interface printed circuit board PCB are also overlapped each other and are bonded by compression in the direction indicated by the arrow P.

Here, when the arrangement of the input terminals of the first flexible printed circuit board FPC1 is not uniform, by providing a dummy conductive pattern between the input terminals of the first flexible printed circuit board FPC1 in the same manner as the above-mentioned dummy conductive pattern (see DPN in FIG. 1B), it is possible to suppress the occurrence of cracks in the interface printed circuit board PCB.

Figure 4:
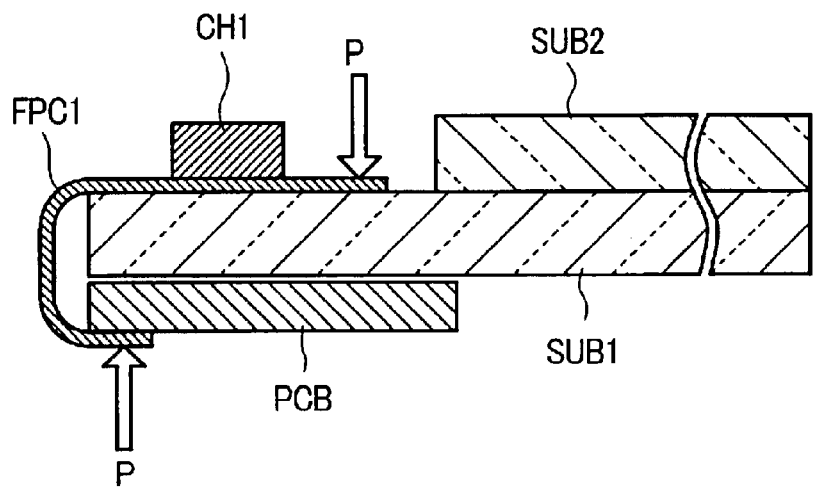
FIG. 4 is a schematic cross-sectional view for explaining an essential part of another embodiment of the liquid crystal display device according to the present invention.

FIG. 4 is a schematic cross-sectional view showing another embodiment of the liquid crystal display device according to the present invention. In this liquid crystal display device, the gate driver CH1 is mounted on the first flexible printed circuit board FPC1. Accordingly, the output terminals of the first flexible printed circuit board FPC1 are directly connected by compression bonding to electrode terminals formed on the first substrate SUB1. The compression bonding is also performed in the direction indicated by an arrow P.

Also in this embodiment, input terminals of the first flexible printed circuit board FPC1 are connected to terminal portions of an interface printed circuit board PCB. The interface printed circuit board PCB is bent toward a back surface of the first substrate SUB1 and is accommodated in the rear surface of the liquid crystal display panel. The input terminals of the first flexible printed circuit board FPC1 and the terminals of the interface printed circuit board PCB are also overlapped to each other and are bonded by compression in the direction indicated by the arrow P.

Also in this case, when the arrangement of the input terminals of the first flexible printed circuit board FPC1 is not uniform, by providing a dummy conductive pattern between the input terminals of the first flexible printed circuit board FPC1 in the same manner as the above-mentioned dummy conductive pattern (see DPN in FIG. 1B), it is possible to suppress the occurrence of cracks in the interface printed circuit board PCB.

Figure 5:
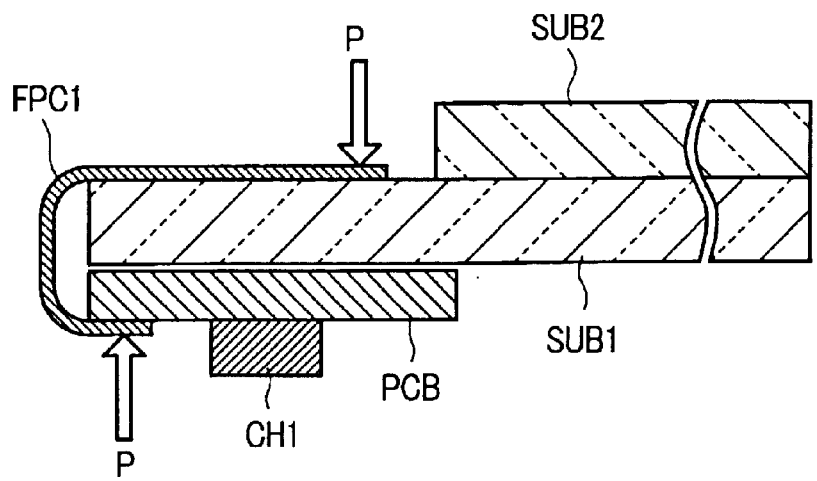
FIG. 5 is a schematic cross-sectional view for explaining an essential part of still another embodiment of the liquid crystal display device according to the present invention.

FIG. 5 is a schematic cross-sectional view showing another embodiment of the liquid crystal display device according to the present invention. In this liquid crystal display device, the gate driver CH1 is mounted on the interface printed circuit board PCB. The output terminals of the first flexible printed circuit board FPC1 are directly connected by compression bonding to electrode terminals formed on the first substrate SUB1. The compression bonding is also performed in the direction indicated by an arrow P.

Also in this embodiment, input terminals of the first flexible printed circuit board FPC1 are connected to terminal portions of an interface printed circuit board PCB. The interface printed circuit board PCB is bent toward a back surface of the first substrate SUB1 and is accommodated in the rear surface of the liquid crystal display panel. The input terminals of the first flexible printed circuit board FPC1 and the terminals of the gate drivers CH1 which are mounted on the interface printed circuit board PCB are bonded to each other by compression in the direction indicated by the arrow P.

Also in this case, when the arrangement of the input terminals of the first flexible printed circuit board FPC1 is not uniform, by providing a dummy conductive pattern between the input terminals of the first flexible printed circuit board FPC1 in the same manner as the above-mentioned dummy conductive pattern (see DPN in FIG. 1B), it is possible to suppress the occurrence of cracks in the interface printed circuit board PCB.

Figure 6:
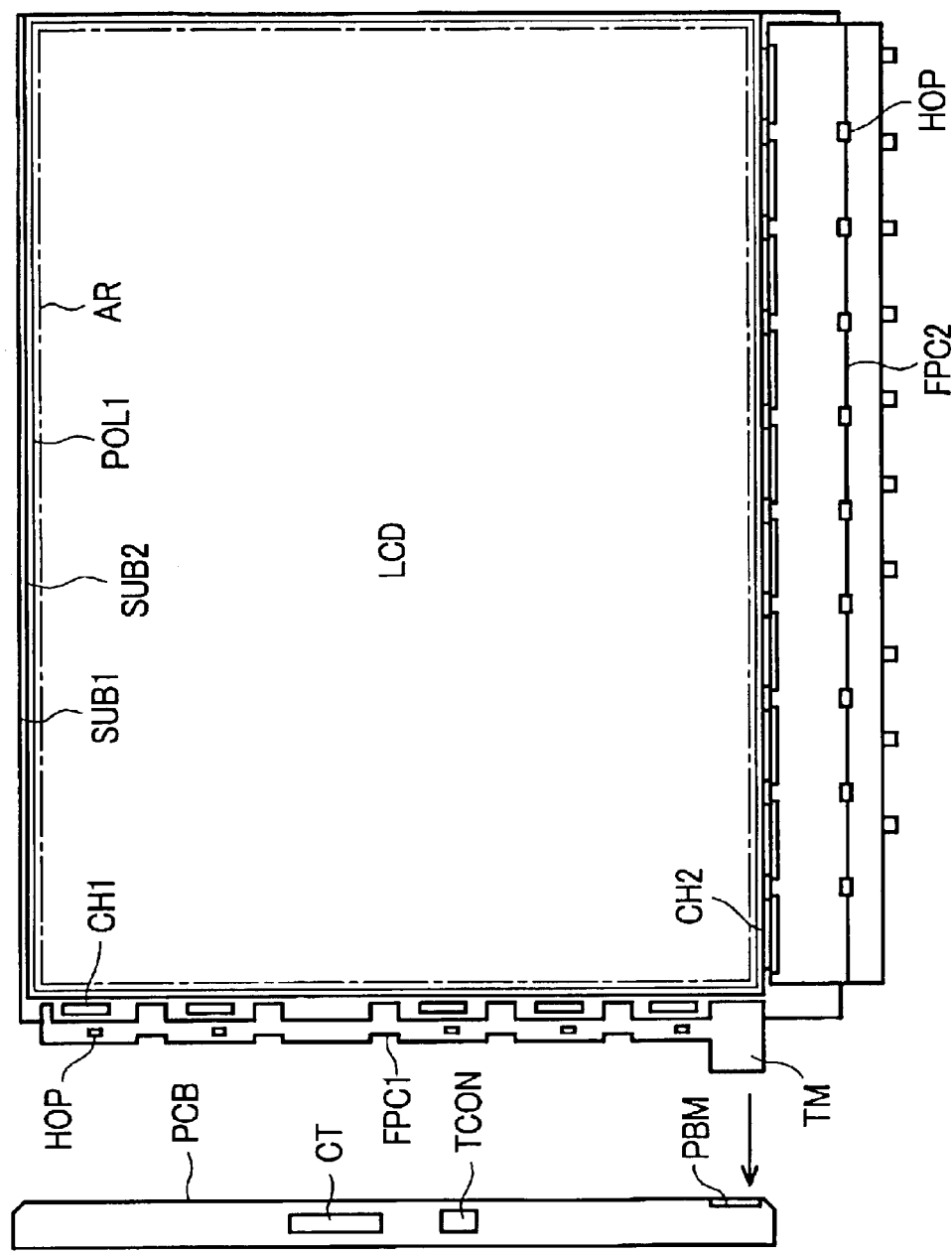
FIG. 6 is a plan view for explaining a specific example of the liquid crystal display device according to the present invention.
Figure 7A:
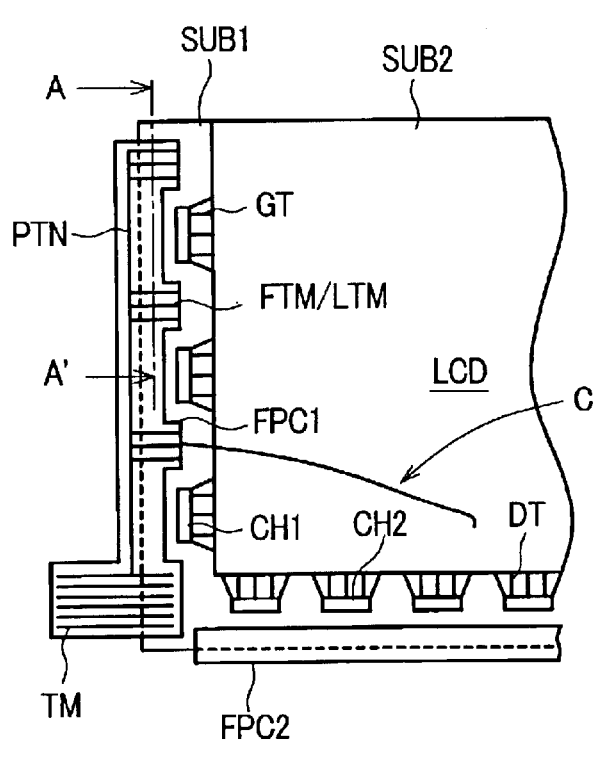
Figure 7B:
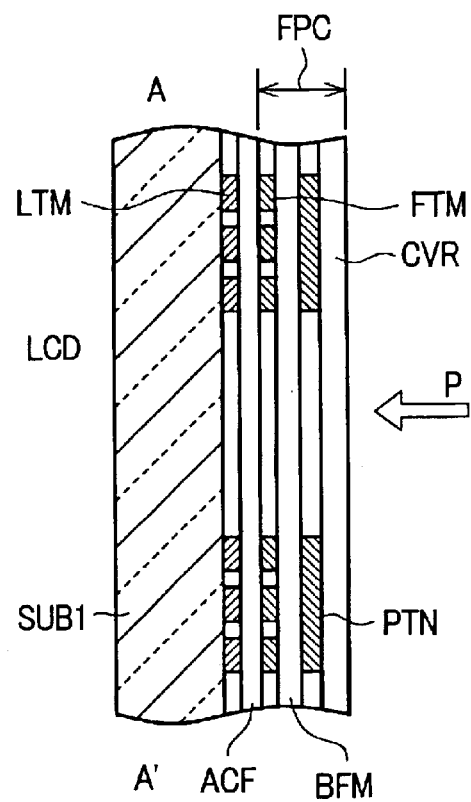

FIG. 6 is a plan view for explaining a specific example of the liquid crystal display device according to the present invention. The first flexible printed circuit board FPC1 is mounted on a left side (a lateral direction side at the left in the drawing) of the liquid crystal display panel LCD which is formed by laminating the first substrate SUB1 and the second substrate SUB2. The second flexible printed circuit board FPC2 is mounted on a lower side (a longitudinal direction side at the lower side in the drawing) of the liquid crystal display panel LCD and is folded back toward the rear surface of the liquid crystal display panel PNL along the arrangement of openings HOP for bending.

Further, both of the gate drivers CH1 and the drain drivers CH2 are directly mounted on the periphery of the first substrate SUB1. A timing converter TCON is mounted on the interface printed circuit board PCB and various signals and voltages for displaying are supplied to the interface printed circuit board PCB from an external circuit (host computer) through a connector CT. The input terminal TM of the first flexible printed circuit board FPC1 is connected to a terminal PBM of the interface printed circuit board PCB.

Signals supplied to the second flexible printed circuit board FPC2 served for the above-mentioned displaying are supplied through wiring extending from the first flexible printed circuit board FPC1 to the first substrate SUB1. The first flexible printed circuit board FPC1 and the second flexible printed circuit board FPC2 are bent toward the back surface of the liquid crystal display panel LCD. The interface printed circuit board PCB is also accommodated in the back surface of the liquid crystal display panel LCD in the same manner. Here, an upper polarizer POL1 is laminated to a display screen side (front surface of the second substrate SUB2) of the liquid crystal display panel LCD and a display region AR is formed in the inside of the liquid crystal display panel LCD.

As has been explained heretofore in conjunction with several embodiments, according to the present invention, it is possible to obviate the occurrence of cracks on the substrate of the liquid crystal display panel at the time of connecting the output terminals of the flexible printed circuit board to the panel input terminals of the liquid crystal display panel by compression bonding so that it is possible to provide the liquid crystal display device which can enhance the reliability thereof.

What is claimed is:

1. A liquid crystal display device including a liquid crystal display panel which forms a display region by sandwiching liquid crystal between a pair of substrates having electrodes for selecting pixels on one inner surface or both inner surfaces thereof and has panel input terminals at a periphery of one of the pair of substrates for applying display signals to a plurality of electrode terminals pulled out of the display region, and a flexible printed circuit board having a multi-layered structure which includes output terminals connected to the panel input terminals for applying display signals to the electrodes, the improvement being characterized in that the panel input terminals are formed of a plurality of groups of terminals which are arranged at a given interval along the longitudinal direction of the periphery of one of the pair of substrates, the flexible printed circuit board includes input terminals which are connected to an external circuit and the output terminals which are connected to the panel input terminals, and a conductive pattern which connects the input terminals and the output terminals by wiring, and at portions of the flexible printed circuit board corresponding to positions between the groups of electrode terminals of the liquid crystal display panel, dummy conductive patterns which are capable of reducing the stress concentration when the output terminals of the flexible printed circuit boards overlap the corresponding panel input terminals of the liquid crystal display panel to connect by compression bonding are provided.

2. A liquid crystal display device according to claim 1, wherein driving circuit chips which apply display signals to the electrode terminals are directly mounted on one substrate between the electrode terminals and the groups of panel input terminals.

3. A liquid crystal display device according to claim 1, wherein driving circuit chips which apply display signals to the electrode terminals are mounted on the flexible printed circuit board.

4. A liquid crystal display device according to claim 1, wherein the liquid crystal display device includes an interface printed circuit board to which the input terminals of the flexible printed circuit board are connected, and driving circuit chips which supply display signals to the electrode terminals are mounted on the interface printed circuit board.

5. A liquid crystal display device comprising:

a liquid crystal display panel having a display region which includes a pair of substrates, a liquid crystal layer sealed between the pair of substrates, and a plurality of pixels formed in a state that the pixels face the liquid crystal layer;

a control circuit which controls an image display operation performed by the plurality of pixels; and a flexible printed circuit board which has a plurality of connection terminals which are connected to one end portion of one of the pair of substrates and transfers image display control signals or video data from the control circuit to the liquid crystal display panel through the connection terminals, wherein the flexible printed circuit board includes a trunk portion which extends along the end portion of one substrate and a plurality of branch portions which are projected corresponding to respective groups of the plurality of connection terminals from the trunk portion to the end portion of one substrate;

the trunk portion and the branch portions have a laminated structure which is constituted of a pair of flexible films and a plurality of first conductive layers formed between the pair of flexible films corresponding to the branch portions;

respective groups of the plurality of connection terminals are formed on an outer surface of one of the pair of flexible films such that respective groups of the plurality of connection terminals correspond to the plurality of branch portions; and between the pair of flexible films, second conductive layers are formed in a spaced-apart manner such that each second conductive layer is arranged between a pair of neighboring first conductive layers among the plurality of first conductive layers.

6. A liquid crystal display device according to claim 5, wherein the second conductive layers are electrically separated from both of wiring for transferring signals and wiring for supplying electric power to the liquid crystal display panel in the flexible printed circuit board.

7. A liquid crystal display device according to claim 5, wherein the second conductive layers are arranged in a plural number in parallel on the trunk portion of the flexible printed circuit board at the liquid crystal display panel side of the trunk portion and along the extending direction of the trunk portion.

* * * * *